(12) United States Patent
Rao et al.

(10) Patent No.: US 9,401,702 B2
(45) Date of Patent: Jul. 26, 2016

(54) BINARY FREQUENCY SHIFT KEYING WITH DATA MODULATED IN DIGITAL DOMAIN AND CARRIER GENERATED FROM INTERMEDIATE FREQUENCY

(71) Applicant: Texas Instruments Incorporated, Dallas, TX (US)

(72) Inventors: Aswin Srinivasa Rao, Dallas, TX (US); Anand Kudari, Bangalore (IN); Karthik Subburaj, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/250,880

(22) Filed: Apr. 11, 2014

(65) Prior Publication Data

US 2015/0295569 A1 Oct. 15, 2015

(51) Int. Cl.
  *H03C 1/00* (2006.01)
  *H03K 7/06* (2006.01)
  *H04L 27/12* (2006.01)
  *H04L 27/10* (2006.01)

(52) U.S. Cl.
  CPC ........ *H03K 7/06* (2013.01); *H04L 27/10* (2013.01); *H04L 27/12* (2013.01); *H04L 27/127* (2013.01)

(58) Field of Classification Search
  CPC ....... H04L 27/10; H04L 27/106; H04L 27/12; H04L 27/127
  USPC .......... 332/100, 101, 102; 375/260, 272, 295, 375/303
  See application file for complete search history.

(56) References Cited

U.S. PATENT DOCUMENTS

| 5,430,890 A | 7/1995 | Vogt et al. |
| 5,513,219 A * | 4/1996 | Ham ................. H04L 27/144 329/300 |
| 6,198,353 B1 | 3/2001 | Janesch et al. |

(Continued)

FOREIGN PATENT DOCUMENTS

RU  2011131745 A  7/2011

OTHER PUBLICATIONS

Aswin Srinivasa Rao and Karthik Subburaj "A 300KBPS 23.2MHz Binary Frequency Shift Keying Transmitter in 180nm BiCMOS for USB3.0 Power Line Communication," Power Interface, Texas Instruments, Dallas, TX; Wireless Connectivity Texas Instruments, India, 4 pages.

(Continued)

*Primary Examiner* — Arnold Kinkead
(74) *Attorney, Agent, or Firm* — William B. Kempler; Frank D. Cimino

(57) ABSTRACT

Binary frequency shift keying modulation is implemented by choosing appropriate phases of a high frequency clock to generate a modulated intermediate clock frequency. The high frequency clock is chosen to be (M+0.5)*fc, where fc is the carrier frequency and M is an integer. Depending on the binary data '1' or '0' to be transmitted, 'M' or 'M+1' clock phases from the high frequency clock are converted to an intermediate clock that is 2*N times faster than the carrier frequency, where N is an integer. This intermediate clock, generated entirely in the digital domain, has the required data modulation in it, and is used to generate N pulse width modulated (PWM) phases of waveforms operating at the carrier frequency. The N phases are then weighed appropriately to synthesize a sine waveform whose lower harmonics are substantially suppressed.

20 Claims, 3 Drawing Sheets

(56) References Cited

U.S. PATENT DOCUMENTS

| | | | | |
|---|---|---|---|---|
| 7,495,520 B2* | 2/2009 | Mellot | ............ | G06F 1/0321 332/100 |
| 2004/0196915 A1* | 10/2004 | Gupta | ............ | 375/260 |

OTHER PUBLICATIONS

Ginsburg, et al., "Highly-Linear FM Transmitter for Mobile Application in 65nm CMOS," Radio Frequency Integrated Circuits Symposium (RFIC), 2011 IEEE, Jun. 5-7, 2011, pp. 1-4.

Perrott, et al., "A 27-mW CMOS Fractional-N Synthesizer Using Digital Compensation for 2.5-Mb/s GFSK Modulation," IEEE Journal of Solid-State Circuits, IEEE, vol. 32, No. 12, Dec. 1997, pp. 2048-2060.

Jonsson, et al., "A Low-Leakage Open-Loop Frequency Synthesizer Allowing Small-Area On-Chip Loop Filter," Microwave Theory and Techniques, IEEE Transactions on Circuits and Systems II: Express Briefs, IEEE, vol. 56, No. 3, Mar. 2009, pp. 195-199.

Masuch, et al., "A Sub-10 nJ/b+1.9-dBm Output Power FSK Transmitter for Body Area Network Applications," IEEE Transactions on Microwave Theory and Techniques, IEEE, vol. 60, No. 5, May 2012, pp. 1413-1423.

Liu, et al., "An Energy-Efficient 1.5-Mbps Wireless FSK Transmitter with a ΣΔ-Modulated Phase Rotator," Solid ESSCIRC 2007, 33rd European Solid State Circuits Conference, Sep. 13, 2007, pp. 488-491.

Yang, et al., "A 5-GHz Direct Digital Frequency Synthesizer Using an Analog-Sine-Mapping Technique in 0.35-µm SiGe BiCMOS" IEEE Journal of Solid-State Circuits, vol. 46, No. 9, Sep. 2011, pp. 2064-2072.

Thuries, et al., "A 6-GHz Low-Power BiCMOS SiGe:C 0.25 µm Direct Digital Synthesizer," IEEE Microwave and Wireless Components Letters, vol. 18, No. 1, Jan. 2008, pp. 46-48.

Geng, et al., "An 11-Bit 8.6 GHz Direct Digital Synthesizer MMIC With 10-Bit Segmented Sine-Weighted DAC," IEEE Journal of Solid-State Circuits, vol. 45, No. 2, Feb. 2010, pp. 300-313.

Raab, et al., "Power Amplifiers and Transmitters for RF and Microwave," IEEE Transactions on Microwave Theory and Techniques, vol. 50, No. 3, Mar. 2002, pp. 814-826.

Bae, et al., "A 0.24-nJ/b Wireless Body-Area-Network Transceiver With Scalable Double-FSK Modulation," IEEE Journal of Solid-State Circuits, vol. 47, No. 1, Jan. 2012, pp. 310-322.

Search Report for PCT Application No. PCT/US2015/25590 (see RU2011131745), mailed Jul. 23, 2015.

Aswin Srinivasa Rao and Karthik Subburaj "A 300KBPS 23.2MHz Binary Frequency Shift Keying Transmitter in 180nm BiCMOS for USB3.0 Power Line Communication," Power Interlace, Texas Instruments, Dallas, TX: Wireless Connectivity Texas Instruments, India, 4 pages, 2015 28th International Conference on VLSI Design and 2015 14th International Conference on Embedded Systems.

* cited by examiner

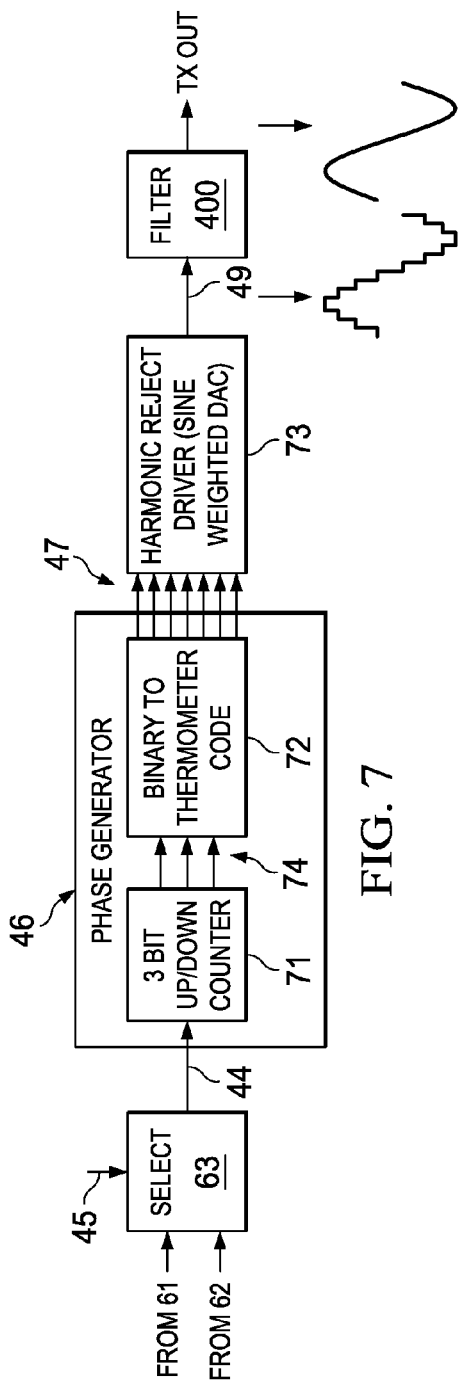

FIG. 7

| PHASE LOCK LOOP | BINARY FSK DATA | DIGITAL RATE CONVERTER | DIGITAL PHASE GENERATOR | DRIVER OUTPUT | EXTERNAL RC FILTER |
|---|---|---|---|---|---|
| 545.2MHz (=11.6x47) | DATA 1 (MARK) | 379.3MHz | 23.71MHz | 23.71MHz | 23.71MHz |
| | FREQUENCY SCALING FACTOR | =545.2 x (16/23) | =379.3/16 (8 SQUARE WAVE PHASES) | SINE WAVE (STRONG 15TH AND 17TH HARMONIC) | SINE WAVE (SUPPRESS 15TH AND 17TH HARMONIC) |
| | DATA 0 (SPACE) | 363.4MHz | 22.71MHz | 22.71MHz | 22.71MHz |
| | FREQUENCY SCALING FACTOR | =545.2 x (16/24) | =363.4/16 (8 SQUARE WAVE PHASES) | SINE WAVE (STRONG 15TH AND 17TH HARMONIC) | SINE WAVE (SUPPRESS 15TH AND 17TH HARMONIC) |

FIG. 8

BINARY FREQUENCY SHIFT KEYING WITH DATA MODULATED IN DIGITAL DOMAIN AND CARRIER GENERATED FROM INTERMEDIATE FREQUENCY

FIELD

The present work relates generally to modulation for data transmission and, more particularly, to binary frequency shift keying modulation.

BACKGROUND

Binary frequency shift keying (BFSK) is a form of data modulation commonly used in communications technologies. For example, transmit architectures for implementing the USB Power Delivery (USBPD) specification must use low power BFSK, and must comply with requirements including an eye diagram for frequency switching, an FCC transmit frequency spectrum, and a current budget for average transmit power. Such compliance may necessitate excessive architectural complexity, excessive circuit area and burdensome test, debug and validation requirements. FIGS. 1-3 diagrammatically illustrate prior art approaches to implementation of the USBPD specification.

The architecture of FIG. 1 (square wave-to-triangle wave-to-class A driver) is conceptually simple, but introduces harmonics that require complex on-chip filtering, has high operating current requirements, and presents difficulties in output amplifier control across PVT (process, voltage, temperature). The FIG. 2 architecture (direct digital synthesis) has a simple implementation and facilitates testing, but is less attractive with respect to power consumption and circuit area. The FIG. 3 architecture (PLL loop modulation) is conceptually simple, and is well-suited for low data rate switching, but presents difficulty in meeting the eye diagram at a USBPD-compliant data rate (e.g., 320 kbps), and requires a considerable amount of time for design, test and calibration, especially with respect to controlling the PLL (phase locked loop) bandwidth.

It is desirable in view of the foregoing to provide for BFSK modulation, for example, to implement the USBPD specification, while avoiding disadvantages such as described above.

BRIEF DESCRIPTION OF THE DRAWINGS

FIG. 7 diagrammatically illustrates the transmit architecture of FIGS. 4-6 in more detail according to example embodiments of the present work.

FIG. 8 summarizes in tabular format frequency planning for the transmit architecture embodiments of FIGS. 4-7 according to the present work.

DETAILED DESCRIPTION

Example embodiments of the present work implement BFSK modulation by choosing appropriate phases of a high frequency clock to generate a modulated intermediate clock frequency. The high frequency clock is chosen to be $(M+0.5)*fc$, where fc is the carrier frequency and M is an integer. Depending on the binary data '1' or '0' to be transmitted, 'M' or 'M+1' clock phases from the high frequency clock are converted to an intermediate clock that is $2*N$ times faster than the carrier frequency, where N is an integer. This intermediate clock, generated entirely in the digital domain, has the required data modulation in it, and is used to generate N pulse width modulated (PWM) phases of waveforms operating at the carrier frequency. The N phases are then weighed appropriately to synthesize an output sine waveform. In some embodiments, significant harmonic content is present in the output sine waveform only at the $(2*N-1)^{th}$ harmonic and upwards, and this content can be attenuated using an external RC filter.

Figure 1:
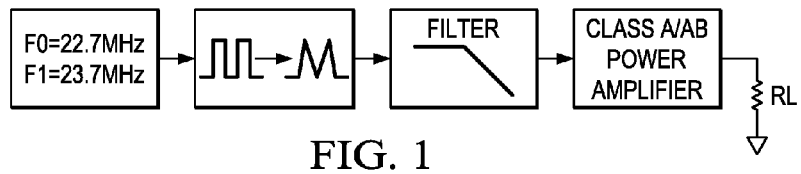
FIGS. 1-3 diagrammatically illustrate prior art transmit architectures.
Figure 2:
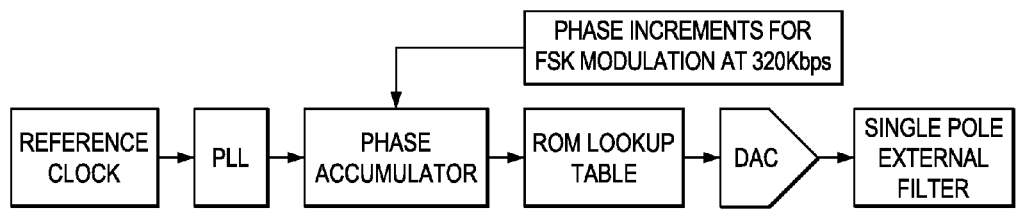
Figure 3:
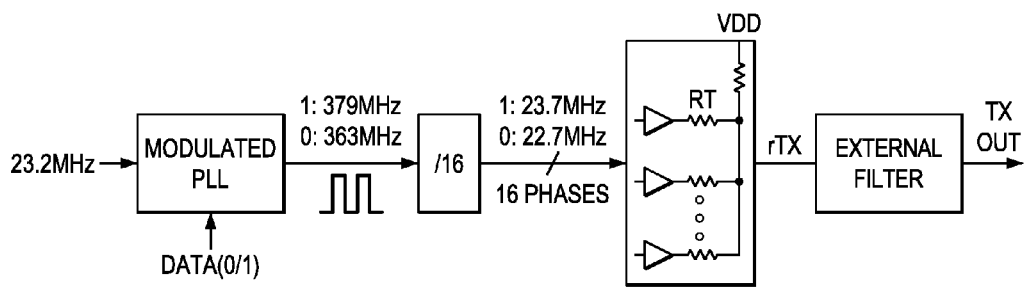
Figure 4:
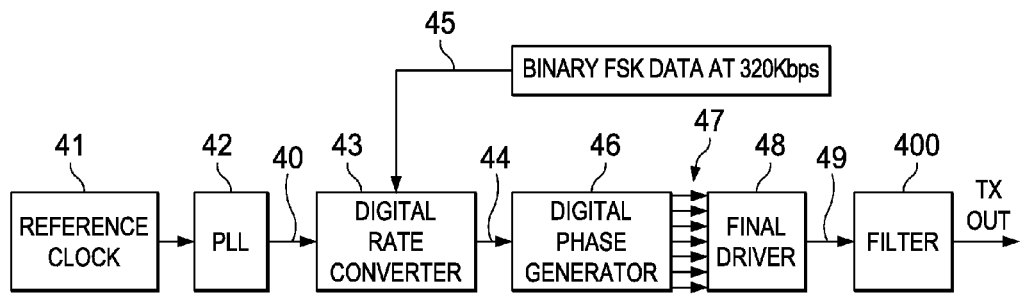
FIG. 4 diagrammatically illustrates example embodiments of transmit architecture according to the present work.

FIG. 4 diagrammatically illustrates example embodiments of transmit architecture according to the present work. In some embodiments, the components shown at 40-49 are provided on a single integrated circuit chip. A reference clock 41 drives a PLL 42 (a static integer divider PLL in some embodiments) which provides a high frequency clock 40 at $(M+0.5)*fc$. The clock 40 is input to a digital rate converter (DRC) 43 that converts M or M+1 clock phases from the clock 40 to an intermediate clock 44 that is $2*N$ times faster than fc. The DRC 43 also receives (at 45) the data to be transmitted. M phases or clock edges from the clock 40 are converted to transmit a 1, whereas M+1 phases or clock edges are converted to transmit a 0. The intermediate clock 44, having the necessary modulation in it, is input to a digital phase generator 46 that uses the clock 44 to generate N pulse width modulated phases 47 of waveforms operating at the carrier frequency fc. The phases 47 are input to a driver 48 that performs harmonic rejection mixing, weighting the phases appropriately to synthesize an output sine waveform 49 whose only significant harmonics are at the $(2*N-1)$th and upward. These harmonics are attenuated by a filter 400. In some embodiments, the filter 400 is on-chip, whereas other embodiments use an external (off-chip) filter. In some embodiments, the filter 400 is a single pole RC filter. Some embodiments use the output impedance of the driver 48 as the R for the RC filter, such that C is the only extra passive component needed for the filter. Some embodiments use higher order filters for better harmonic rejection.

Figure 5:
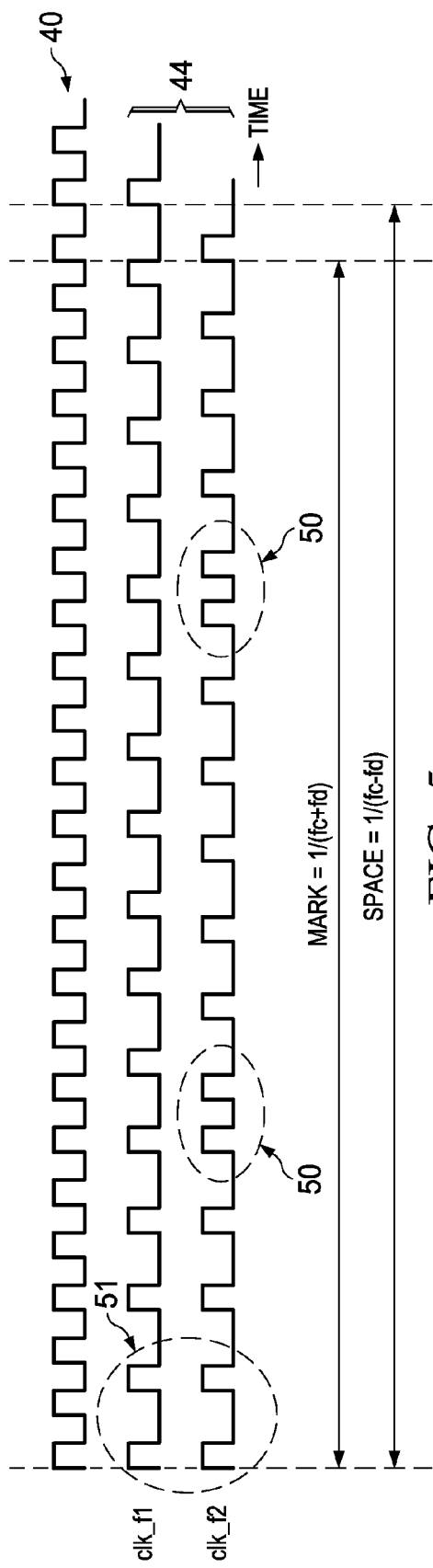
FIG. 5 is a timing diagram that illustrates operation of the digital rate converter of FIG. 4 according to example embodiments of the present work.

FIG. 5 is a timing diagram that illustrates operation of the DRC 43 of FIG. 4, with M=23 and N=8, according to example embodiments of the present work. The aforementioned conversion of M+1=24 phases from clock 40 (for data=0, also referred to herein as Space) corresponds to clock signal clk_f1, and the aforementioned conversion of M=23 phases from clock 40 (for data=1, also refereed to herein as Mark) corresponds to clock signal clk_f2. The signal clk_f1 is produced by triggering pulses on the alternate rising and falling edges of clock 40, as shown at 51 in FIG. 5. The signal clk_f2 is produced in the same manner, with the exception of selected instances 50 when two consecutive pulses are triggered on consecutive rising edges of clock 40. Adjacent ones of the instances 50 are separated in time from one another by five of the aforementioned alternately triggered pulses.

With fc=23.2 MHz for USBPD, clock 40 has a frequency of $(23+0.5) \times 23.2 = 545.2$ MHz. For clk_f1, M+1=24 pulses of clock 40 are converted to 16 ($2N=2\times 8$) pulses. For clk_f2, M=23 pulses of clock 40 are converted to 16 pulses. Thus, clk_f1 has 16 pulses every $545.2/24 = 22.717$ MHz, and clk_f2 has 16 pulses every $545.2/23 = 23.704$ MHz. Noting that the deviation frequency, fd, of the USBPD specification has a range of 450-600 KHz, it can be seen that the aforementioned 22.717 MHz (associated with clk_f1) and 23.704 MHz (associated with clk_f2) rates respectively comply with the USBPD specification for Space (fc−fd) and Mark (fc+fd). The signal clk_f1 has 16 pulses within the time period 1/(fc−fd), and the signal clk_f2 has 16 pulses within the time period 1/(fc+fd). Thus, clk_f1 and clk_f2 are also referred to herein as "16× clocks." (Note that, solely for convenience of exposition, FIG. 5 shows only a single period length of each signal clk_f1 and clk_f2.) The frequency of clk_f1 is (545/24)×16=363.4 MHz, and the frequency of clk_f2 is (545/23)×16=379.3 MHz.

Figure 6:
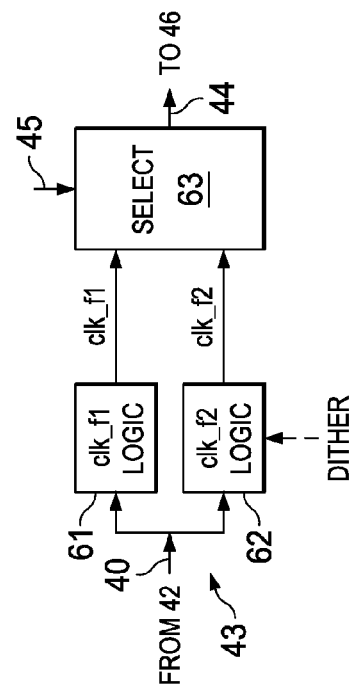
FIG. 6 diagrammatically illustrates the digital rate converter of FIGS. 4 and 5 in more detail according to example embodiments of the present work.

FIG. 6 diagrammatically illustrates the DRC 43 of FIGS. 4 and 5 in more detail according to example embodiments of the present work. As shown, clk_f1 and clk_f2 are produced by respectively corresponding logic portions 61 and 62 driven by the high frequency clock 40. A selector 63 selects clk_f1 or clk_f2 in response, respectively, to a Space (data=0) or Mark (data=1) indication received at 45.

FIG. 7 diagrammatically illustrates the transmit architecture of FIGS. 4-6 in more detail according to example embodiments of the present work. As shown, the digital phase generator 46 includes a 3-bit binary up/down counter 71 driven by the clock 44 provided by the selector 63 of the DRC 43. The output of the counter 71 drives a binary-to-thermometer code converter 72. The counter 71 counts pulses of the clock 44, and its 3-bit binary count output 74 proceeds alternately upwardly and downwardly through a count range extending between 000 and 111, inclusive. The converter 72 converts each digital binary count value at 74 to a corresponding digital thermometer code representation at 47. This thermometer code representation corresponds to the aforementioned N (=8 in the FIG. 7 example) PWM phases.

As shown in FIG. 7, some embodiments implement the driver 48 (see also FIG. 4) with a sine weighted digital-to-analog converter (DAC) 73 that performs harmonic rejection mixing, weighting the PWM phase signals at 47 appropriately to synthesize the sine waveform 49. The sine waveform 49 is configured as shown graphically in FIG. 7, whether clk_f1 or clk_f2 is selected at 63. However, the positive and negative peaks have shorter time duration when (higher frequency) clk_f2 is selected than when (lower frequency) clk_f1 is selected. This is so because (1) the time spacing between each pair of consecutive pulses associated with each instance 50 (see FIG. 5) is smaller than the time spacing between any other pair of consecutive pulses in clk_f1 or clk_f2, and (2) the architecture is configured such that the consecutive pulses of alternate instances 50 correspond to consecutive downwardly proceeding binary count values 111 and 110 at 74, and the consecutive pulses of the remaining alternate instances 50 correspond to consecutive upwardly proceeding binary count values 000 and 001 at 74. In some embodiments, this correspondence between binary count values and the consecutive pulses of instances 50 is achieved by suitably initializing the binary count value 74.

Some embodiments apply dithering in the clk_f2 logic 62 (see FIG. 6) in order to vary the binary count values at 74 (see FIG. 7) to which the consecutive pulses of the instances 50 (see FIG. 5) correspond. Different dithering sequences result in different harmonic content in the output spectrum, which provides the advantageous capability of spreading the harmonics across the output frequency range. In some embodiments, the aforementioned dithering is provided as a selectable option, as indicated by broken line in FIG. 6, such that dithering may either be implemented or not as desired.

FIG. 7 further shows graphically the smoothed sine waveform produced by the filter 400, which attenuates the (2*N−1)th and higher harmonics, that is, the $15^{th}$ and higher harmonics for the example of N=8. In some embodiments, the frequency content of lower harmonics is less than −40 dB (well within the USBPD specification requirement of less than −30 dB). In some embodiments, the filter 400 provides extra −12 dB at the $15^{th}$ harmonic.

FIG. 8 summarizes in tabular format the above-described transmit architecture frequency planning, for a reference clock example of 11.6 MHz and the example 545.2 MHz frequency for clock 40 (see also FIGS. 4-6).

The above-described transmit architecture according to the present work provides, among others, the following example advantages. Because the DRC 43 achieves the desired data modulation, with the required frequency deviation, entirely in the digital domain: complicated analog circuitry is avoided; test, debug and validation are facilitated; the modulation is resistant to PVT variation; and trim is limited to the PLL and driver. In some embodiments, the PLL is a conventional design that is easily implemented. Because the carrier is generated from the intermediate clock 44 (i.e., one of the 16× clocks), the architecture is simplified, avoiding high bandwidth on-chip filters and driver amplifiers, thereby helping to meet the required current budget and transmit spectrum mask. Clean transitions between symbols easily meet the required USBPD eye diagram. The architecture is open loop except for the PLL which, as noted above, may be conventional (and thus a well-defined closed loop system). The open loop characteristics make the architecture stable and robust. Some embodiments require: less than 400 digital logic gates running at 372 and 545 MHz, with worst case dynamic current around 1 mA; PLL current around 1 mA; and total driver current around 7 mA.

Although portions of the foregoing description relate to embodiments used in the context of a USBPD application, various embodiments are used in various applications other than USBPD, and the utility of the present work in a variety of applications is evident. Although example embodiments of the present work have been described above in detail, this does not limit the scope of the work, which can be practiced in a variety of embodiments.

What is claimed is:

1. An apparatus for binary frequency shift keying modulation, comprising:

a phase locked loop (PLL) configured to provide a high frequency clock;

a digital rate converter coupled to said PLL and configured to convert said high frequency clock into first and second clock signals that each have a lower frequency than said high frequency clock, said first clock signal having only a first predetermined number of consecutive pulses within a period of time that contains only a second predetermined number of consecutive pulses of the high frequency clock, said second clock signal having only said first predetermined number of consecutive pulses within a period of time that contains only a third predetermined number of consecutive pulses of the high frequency clock, wherein said second and third predetermined numbers differ from one another and are both greater than said first predetermined number, and wherein said digital rate converter is configured to select between said first and second clock signals based on binary data values selected for transmission;

a digital phase generator coupled to said digital rate converter and configured to generate a plurality of digital phase signals corresponding to a selected one of said first and second clock signals; and a driver coupled to said digital phase generator and configured to weight digital phase signals from said digital phase generator to synthesize an output waveform having binary data values modulated thereon.

2. The apparatus of claim 1, including a filter coupled to said driver and configured to filter said output waveform.

3. The apparatus of claim 2, wherein said PLL, said digital rate converter, said digital phase generator and said driver are provided together in an integrated circuit, and said filter is external relative to said integrated circuit.

4. The apparatus of claim 1, wherein said digital phase generator includes a binary up/down counter configured to count pulses of the selected one of said first and second clock signals.

5. The apparatus of claim 4, wherein said digital phase generator includes a binary-to-thermometer code converter coupled to said counter and configured to convert binary count values produced by said counter into respectively corresponding thermometer code representations.

6. The apparatus of claim 5, wherein said driver includes a sine-weighted digital-to-analog converter (DAC).

7. The apparatus of claim 1, wherein said driver includes a sine-weighted DAC.

8. The apparatus of claim 1, wherein said digital phase signals are pulse width modulated phase signals.

9. The apparatus of claim 1, wherein said output waveform is a sine waveform.

10. The apparatus of claim 1, wherein said output waveform conforms to USB Power Delivery specification.

11. A method of binary frequency shift keying modulation, comprising:
providing a high frequency clock;
converting said high frequency clock into first and second clock signals that each have a lower frequency than said high frequency clock, said first clock signal having only a first predetermined number of consecutive pulses within a period of time that contains only a second predetermined number of consecutive pulses of the high frequency clock, said second clock signal having only said first predetermined number of consecutive pulses within a period of time that contains only a third predetermined number of consecutive pulses of the high frequency clock, wherein said second and third predetermined numbers differ from one another and are both greater than said first predetermined number;
selecting between said first and second clock signals based on binary data values selected for transmission;
generating a plurality of digital phase signals corresponding to a selected one of said first and second clock signals; and
weighting digital phase signals from said generating to synthesize an output waveform having binary data values modulated thereon.

12. The method of claim 11, including filtering said output waveform.

13. The method of claim 11, wherein said generating includes counting pulses of the selected one of said first and second clock signals.

14. The method of claim 13, wherein said generating includes converting binary count values produced by said counting into respectively corresponding thermometer code representations.

15. The method of claim 11, wherein said digital phase signals are pulse width modulated phase signals.

16. The method of claim 11, wherein said output waveform is a sine waveform.

17. The method of claim 11, wherein said output waveform conforms to USB Power Delivery specification.

18. An apparatus for binary frequency shift keying modulation, comprising:
means for providing a high frequency clock;
means for converting said high frequency clock into first and second clock signals that each have a lower frequency than said high frequency clock, said first clock signal having only a first predetermined number of consecutive pulses within a period of time that contains only a second predetermined number of consecutive pulses of the high frequency clock, said second clock signal having only said first predetermined number of consecutive pulses within a period of time that contains only a third predetermined number of consecutive pulses of the high frequency clock, wherein said second and third predetermined numbers differ from one another and are both greater than said first predetermined number;
means for selecting between said first and second clock signals based on binary data values selected for transmission;
means for generating a plurality of digital phase signals corresponding to a selected one of said first and second clock signals; and
means for weighting digital phase signals from said means for generating to synthesize an output waveform having binary data values modulated thereon.

19. The apparatus of claim 18, wherein said means for generating includes means for counting pulses of the selected one of said first and second clock signals, and means for converting binary count values produced by said counting into respectively corresponding thermometer code representations.

20. The apparatus of claim 18, including means for filtering said output waveform.

* * * * *